(12) United States Patent
Chien et al.

(10) Patent No.: US 6,204,195 B1
(45) Date of Patent: *Mar. 20, 2001

(54) METHOD TO PREVENT CMP OVERPOLISH

(75) Inventors: Rong-Wu Chien, Hsinchu; Chia-Hui Wu, Kaohsung; Honda Pai, Hsinchu, all of (TW)

(73) Assignee: Vanguard International Semiconductor Corporation, Hsin-Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/166,734
(22) Filed: Oct. 5, 1998
(51) Int. Cl.⁷ .................. H01L 21/302; H01L 21/8242
(52) U.S. Cl. .................. 438/759; 438/692; 438/633; 438/760; 438/244; 438/253
(58) Field of Search .................. 438/633, 759, 438/691, 690–93, 760, 244, 253

(56) References Cited

U.S. PATENT DOCUMENTS

| | | | |
|---|---|---|---|
| 5,663,108 | 9/1997 | Lin | 438/624 |
| 5,688,713 | 11/1997 | Linliu et al. | 437/60 |
| 5,714,779 | 2/1998 | Aver et al. | 257/306 |
| 5,748,521 | 5/1998 | Lee | 365/149 |
| 5,879,981 * | 3/1999 | Tanigawa | 438/241 |
| 6,008,085 * | 12/1999 | Sung et al. | 438/253 |
| 6,022,807 * | 2/2000 | Lindsey, Jr. et al. | 438/693 |

* cited by examiner

*Primary Examiner*—Tuan H. Nguyen
*Assistant Examiner*—Thanh Nguyen
(74) *Attorney, Agent, or Firm*—George O. Saile; Stephen B. Ackerman

(57) ABSTRACT

A process for avoiding dishing in a planarizing layer whose final thickness is reduced by Chem. Mech. Polishing, is described. The first step is to coat the surface to be planarized with a layer of a hard dielectric material, such as silicon nitride, prior to depositing the planarizing medium. After the latter has been reflowed, its thickness is reduced by means of CMP. While CMP is being applied, the etch rate is constantly sensed. When the etch front approaches the aforementioned hard layer a decrease in the etch rate is sensed and etching is terminated, thereby eliminating any dishing effects.

20 Claims, 3 Drawing Sheets

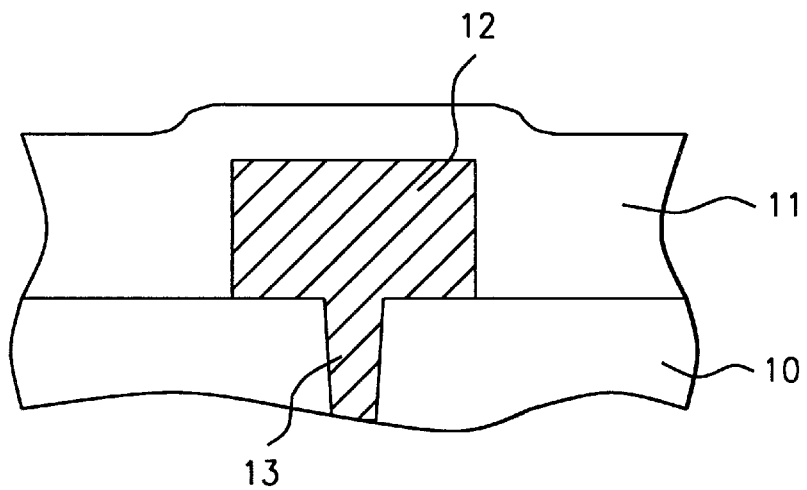
FIG. 1 – Prior Art
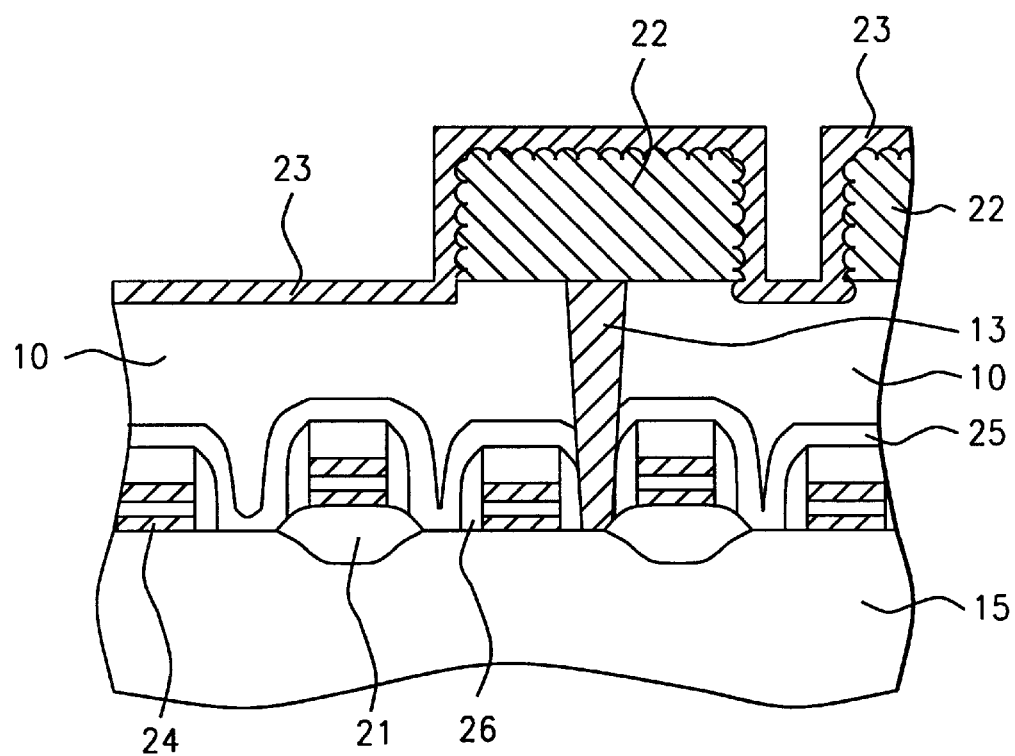
FIG. 2

METHOD TO PREVENT CMP OVERPOLISH

FIELD OF THE INVENTION

The invention relates to the general field of chem.-mech. polishing with particular reference to dishing effects.

BACKGROUND OF THE INVENTION

As the dimensions of integrated circuits continue to shrink, problems that had previously not shown themselves begin to emerge. An example of this occurs when CMP (chemical mechanical polishing) is used as the final step of a planarization process during the manufacture of an integrated circuit. In FIG. 1 we show a schematic representation of the problem. After via hole 13 was formed in dielectric layer 10, it was filled with a plug of a suitable conductive material, following which a metallic layer was deposited onto the surface of 10 and then patterned into the shape of the line 12 (whose direction is into the plane of the drawing). This structure was then covered with a planarizing layer 11. Initially, layer 11 is made thick enough so that all steps on the surface are fully covered. Layer 11 is then heated to the point that it softens thereby planarizing the surface. At this stage layer 11 is too thick so it needs to be reduced to a thickness such that layer 12 is either exposed or, more commonly, only just covered.

The etching technique used to reduce the thickness of 11 is often CMP because of its tendency to provide a planar etch front rather than to follow the initial contours of the surface. Particularly if layer 11 comprises a relatively soft material (such as, for example, boro-phosphosilicate glass) there is a tendency for 'dishing' to occur in the vicinity of the step formed by line 12, as illustrated in the figure.

In the course of searching for prior art that provided a way to deal with this problem we were unable to find the solution taught by the present invention. However, a number of references of interest were found. For example, Auer et al. (U.S. Pat. No. 5,714,779 February 1998) show a capacitor having two dielectric layers that are processed by CMP leaving only one behind on the capacitor. There is however no indication that the layer that is left behind is acting as a CMP stop layer or that it needs to be hard.

Lin (U.S. Pat. No. 5,663,108 September 1997) shows a capacitor that has an oxide layer over a SOG layer and then uses CMP to planarize the SOG layer. Linliu et al. {U.S. Pat. No. 5,688,713 November 1997) shows a cylindrical capacitor while Lee (U.S. Pat. No. 5,748,521 May 1998) shows a capacitor covered by a planarized dielectric layer.

SUMMARY OF THE INVENTION

It has been an object of the present invention to provide a method for planarizing a layer on the surface of an integrated circuit.

Another object of the invention has been to use CMP to accomplish the planarizing but without introducing any dishing.

A further object of the invention has been that said method be easy to apply and be fully compatible with standard IC manufacturing techniques.

These objects have been achieved by first coating the surface to be planarized with a layer of a hard dielectric material, such as silicon nitride, prior to depositing the planarizing medium. After the latter has been reflowed, its thickness is reduced by means of CMP. While CMP is being applied, the etch rate is constantly sensed. When the etch front approaches the aforementioned hard layer a decrease in the etch rate is sensed and etching is terminated, thereby eliminating any dishing effects.

BRIEF DESCRIPTION OF THE DRAWINGS

FIG. 1 is a schematic representation of a step that has been covered by a planarizing layer followed by the application of CMP which results in a certain amount of dishing at the step.

FIG. 2 is a cross-section of an integrated circuit, including a capacitor on its top surface, which needs to be covered and planarized.

DESCRIPTION OF THE PREFERRED EMBODIMENTS

Figure 3:
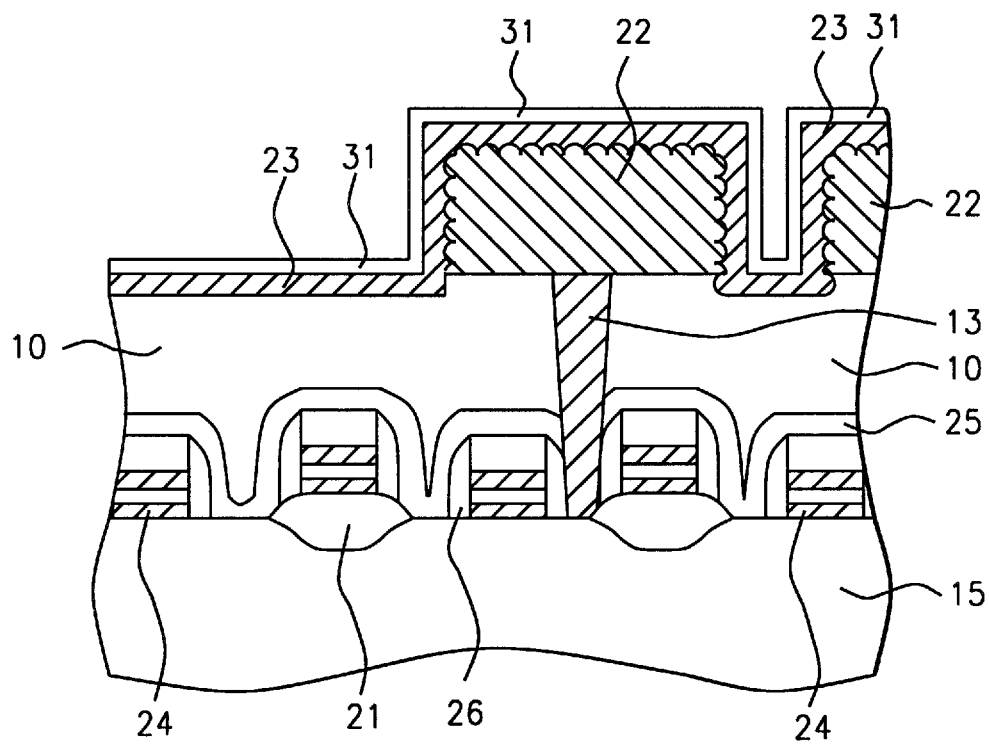
FIG. 3 shows the structure of FIG. 2 after a thin layer of a hard material has been deposited over the entire surface.

In the description of the present invention that is given below we illustrate how it may be used to planarize an ILD (intermediate layer dielectric) in an integrated circuit. It will be understood by those skilled in the art that the invention is more general than this and that it is applicable to any situation where a relatively soft planarizing medium is used.

Referring now to FIG. 2 we show there, in schematic cross-section, part of an integrated circuit whose manufacture is partially complete. Some of the features shown in FIG. 2 include the silicon substrate 15, regions of field oxide such as 21, field effect transistors such as 24, spacers such as 26, and a conformal coating 25 of TEOS (tetra ethyl orthosilicate), which acts as a stop layer against boron or phosphorus ions that could diffuse out of layer 10 (which is usually boro-phosphosilicate glass. These various features were then coated with planarizing layer 10. To provide communication down to the level of the devices, via hole/plug 13 was formed. In this particular example, it was desired to form a capacitor structure on the upper surface of layer 10. The lower plate 22 of the structure was formed in the usual way by depositing a layer of polysilicon and then patterning and etching it into the desired shape. The thickness of layer 22 was between about 0.5 and 1.5 microns. Although not directly relevant to the practice of the present invention, the surface of 22 was roughened (to increase its effective surface area and hence the capacitance per unit area) prior to the deposition of the capacitor dielectric layer. The latter is too thin to show adequately in the figure. To complete the capacitor, top electrode 23 was deposited.

Following the patterning of the top electrode, if normal practice of the prior art were now followed, the next step would be to deposit the planarizing layer. However, in a departure from this pie, the next step, after top electrode deposition, according to the process of the present invention, is to deposit layer 31 which is typically a hard dielectric. Our prefered material for this has been silicon nitride but similar materials such as titanium nitride could also have been used. The preferred process chosen for depositing the silicon nitride (or similar material) was PECVD, although LPCVD could also have been used, because it is known to result in the formation of particularly hard layers. Our preferred thickness for layer 31 is about 500 Angstroms but any between about 300 and 2,000 Angstroms would still be satisfactory. This is followed by the patterning of the top electrode.

Figure 4:
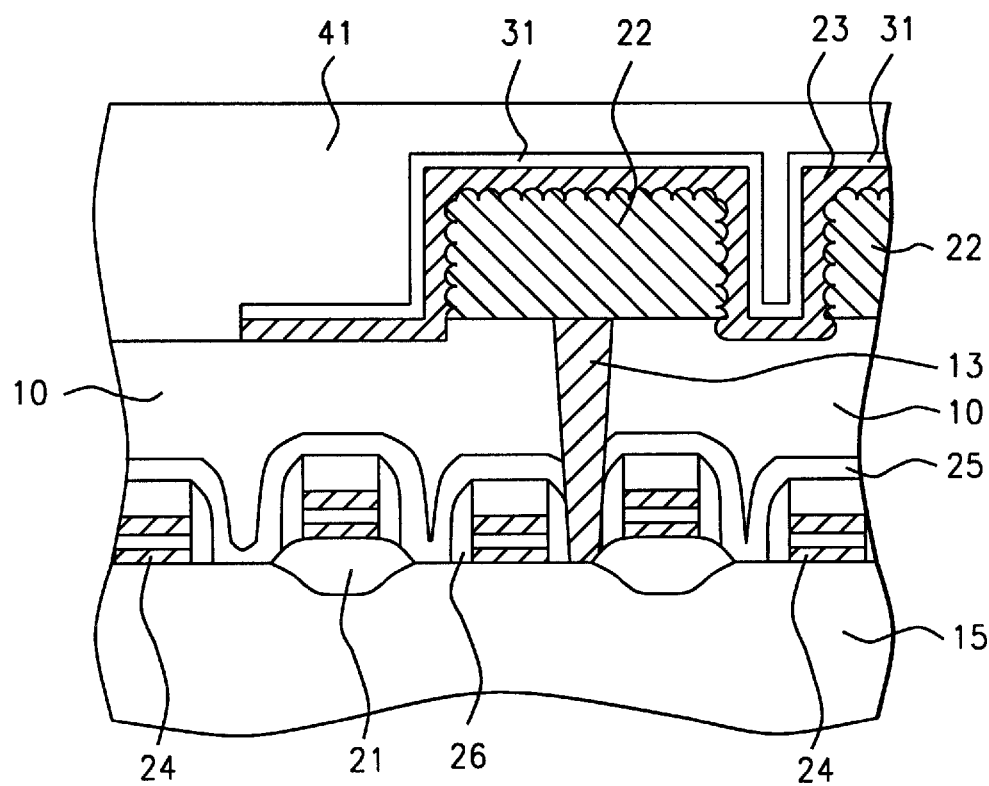
FIG. 4 shows the structure of FIG. 3 after a planarizing medium has been applied and reflowed.

The planarizing material is now deposited. As mentioned above, we have preferred to use boro-phosphosilicate glass for this because it can be reflowed at a relatively low temperature (about 800° C.), but any material (such as spin on glass (SOG) or PE oxide) could have been used provided said reflow temperature was less than this. This is illustrated in FIG. 4 which shows planarizing layer 41 after reflow.

In order to make sure that the convoluted structure sitting on the top surface of 10 was completely covered, layer 41 is necessarily thicker than ultimately desired. CMP is the preferred method for reducing this thickness to the point of just reaching capacitor top electrode 23. This is because the surface of 41, although shown as fully planar in FIG. 4, is, in fact, still relatively uneven after reflow so a method such as CMP which establishes a planar etch front is needed as opposed to an etch method that follow the original contours of the surface.

As already discussed in an earlier section (see FIG. 1), there is normally a problem of 'dishing' associated with the use of CMP under these circumstances. Additionally, traces of slurry could damage or contaminate the top electrode, thereby introducing a serious reliability problem. The problem occurs just as the surface of 23 (in this example) is approached. The CMP dishing problem is particularly severe when a fresh polishing pad, having little wear, is used or when the polishing pad is approaching the end of its useful life. This is a consequence of the sensitivity of the polishing force to the condition of the pad. Fortunately, if CMP is terminated shortly before the surface of 23 is reached the problem will not occur. In order to be able to detect just when this occurs, the etch rate during CMP is sensed throughout the operation. To sense the etch rate our preferred method has been to monitor thickness during polishing but other related quantities could also have been measured.

Figure 5:
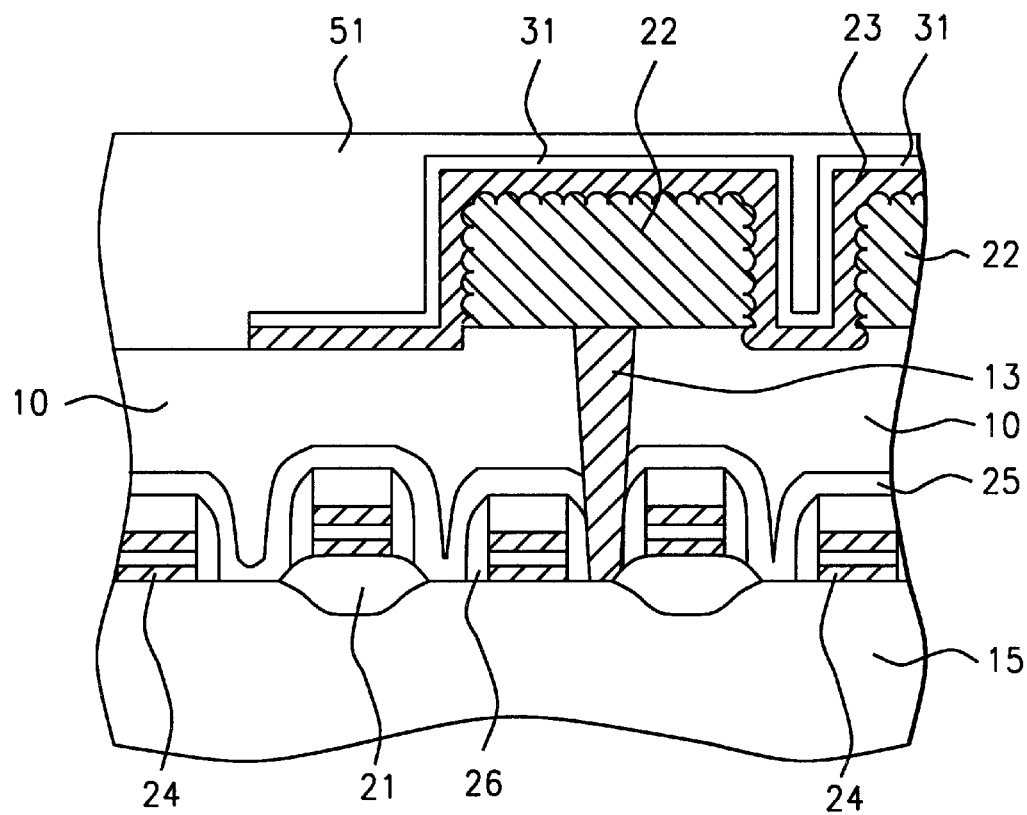
FIG. 5 shows the final appearance of the structure after CMP, with no dishing effects.

Because of the presence of layer 31, which is hard, there is a detectable decrease in the CMP etch rate as soon as the etch front reaches layer 31. As just indicated this can be measured by any of several possible means. We have found that a decrease in the measured etch rate of about 90 percent works very well although any decrease between about 50 and 90% would still be satisfactory. Thus, it becomes relatively straightforward to pick a preset value for this decrease in etch rate and then use this preset value to determine the point at which CMP is terminated. Once this is done the final appearance of the structure is as shown in FIG. 5 where layer 51 (layer 41 after it has been subjected to CMP) Is shown to be barely covering hard layer 31 while at the same time no dishing is While the invention has been particularly shown and described with reference to the preferred embodiments thereof, it will be understood by those skilled in the art that various changes in form and details may be made without departing from the spirit and scope of the invention.

What is claimed is:

1. A process for preventing overpolishing during CMP, comprising:

providing means for measuring polishing rate during CMP;

providing a dielectric layer having a upper surface;

coating said upper surface with a polysilicon layer;

patterning and etching the polysilicon layer thereby forming a step on the upper surface of the dielectric layer;

coating said upper surface and said patterned polysilicon layer, including the step, with a layer of a hard dielectric material;

depositing a planarizing layer on said layer of hard material;

heating said planarizing layer to a temperature sufficient to cause reflow, thereby forming a planar top surface;

by means of CMP, etching the planar top surface while measuring the polishing rate; and terminating CMP when said polishing rate is measured to have decreased by a preset amount.

2. The process of claim 1 wherein the means for measuring polishing rate during CMP is to monitor thickness during polishing.

3. The process of claim 1 wherein the thickness of the polysilicon layer is between about 0.5 and 1.5 microns.

4. The process of claim 1 wherein the hard dielectric material is selected from the group consisting of silicon nitride and titanium nitride.

5. The process of claim 1 wherein the hard dielectric material layer has a thickness between about 500 and 2,000 Angstroms.

6. The process of claim 1 wherein the ILD layer is selected from the group consisting of boro-phosphosilicate glass, spin on glass, and plasma enhanced oxide.

7. The process of claim 1 wherein the temperature sufficient to cause reflow is less than about 800° C.

8. The process of claim 1 wherein CMP is performed using a fresh polishing pad.

9. The process of claim 1 wherein CMP is performed using a polishing pad that is near its end of life.

10. The process of claim 1 wherein said preset amount by which the polishing rate is measured to have decreased is between about 50 and 90%.

11. A process to prevent overpolishing of an ILD layer during manufacture of an integrated circuit, comprising the sequential steps of:

providing means for measuring polishing rate during CMP;

providing a partially completed integrated circuit, including a silicon substrate, regions of field oxide, field effect transistors, spacers, and a first planarizing dielectric layer having an upper surface;

etching a via hole through said first dielectric layer down to the level of the field effect transistors;

filling the via hole with a suitable conductive plug;

coating said upper surface with a polysilicon layer;

etching the polysilicon layer to form a pattern that contacts said conductive plug, thereby forming a step on the upper surface of the dielectric layer;

coating said upper surface, including the step and said polysilicon pattern, with a layer of a hard dielectric material;

depositing an ILD layer on said layer of hard material;

heating said ILD layer to a temperature sufficient to cause reflow, thereby forming a planar top surface;

by means of CMP, etching the planar top surface while measuring the polishing rate; and terminating CMP when said polishing rate is measured to have decreased by a preset amount.

12. The process of claim 11 wherein the means for measuring polishing rate during CMP is to monitor thickness during polishing.

13. The process of claim 11 wherein the thickness of the polysilicon layer is between about 0.5 and 1.5 microns.

14. The process of claim 11 wherein the hard dielectric material is selected from the group consisting of silicon nitride and titanium nitride.

15. The process of claim 11 wherein the hard dielectric material layer has a thickness between about 500 and 2,000 Angstroms.

16. The process of claim 11 wherein the ILD layer is selected from the group consisting of boro-phosphosilicate glass, spin on glass, and plasma enhanced oxide.

17. The process of claim 11 wherein the temperature sufficient to cause reflow is less than about 800° C.

18. The process of claim 11 wherein CMP is performed using a fresh polishing pad.

19. The process of claim 11 wherein CMP is performed using a polishing pad that is near its end of life.

20. The process of claim 11 wherein said preset amount by which the polishing rate is measured to have decreased is between about 50 and 90%.

* * * * *